US012666950B2

(12) United States Patent
Yemenicioglu et al.

(10) Patent No.: US 12,666,950 B2
(45) Date of Patent: Jun. 23, 2026

(54) METAL ROUTING THAT OVERLAPS NMOS AND PMOS REGIONS OF A TRANSISTOR

(71) Applicant: Intel Corporation, Santa Clara, CA (US)

(72) Inventors: Sukru Yemenicioglu, Portland, OR (US); Richard E. Schenker, Portland, OR (US); Xinning Wang, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 321 days.

(21) Appl. No.: 17/710,871

(22) Filed: Mar. 31, 2022

(65) Prior Publication Data
US 2023/0317602 A1    Oct. 5, 2023

(51) Int. Cl.
| | |
|---|---|
| *H10W 20/43* | (2026.01) |
| *H10D 84/01* | (2026.01) |
| *H10D 84/03* | (2025.01) |
| *H10D 84/85* | (2025.01) |

(52) U.S. Cl.
CPC ........ *H10W 20/43* (2026.01); *H10D 84/0186* (2025.01); *H10D 84/038* (2025.01); *H10D 84/85* (2025.01)

(58) Field of Classification Search
CPC ... H01L 23/528; H01L 23/50; H01L 23/5286; H01L 21/76897; H01L 23/5386; H01L 21/768; G06F 30/347; G06F 30/392; G06F 30/394; G06F 30/398; G06F 30/39; H10D 84/00; H10D 84/907; H10D 84/979; H10D 84/981; H10D 84/987;

H10D 89/10; H10D 84/974; H10D 89/00; H10D 84/85; H10D 84/975; H10D 89/921; H10D 1/00; H10D 30/60; H10D 84/0186; H10D 84/038; H10D 84/0158; H10D 84/834; H10D 86/215; H10B 63/80; H10B 10/18; H10B 12/50; H10W 20/43
See application file for complete search history.

(56) References Cited

U.S. PATENT DOCUMENTS

| | | | | |
|---|---|---|---|---|
| 2016/0254256 A1* | 9/2016 | Baek | ...................... | H10B 10/12 |
| | | | | 257/401 |
| 2020/0259080 A1* | 8/2020 | Tanzawa | .............. | H10D 84/038 |
| 2021/0193683 A1* | 6/2021 | Yang | ................ | H03K 19/09429 |

FOREIGN PATENT DOCUMENTS

| | | | | | |
|---|---|---|---|---|---|
| CN | 113964195 A | * | 1/2022 | ........... | H10D 64/517 |

* cited by examiner

*Primary Examiner* — Sonya McCall-Shepard
(74) *Attorney, Agent, or Firm* — Schwabe, Williamson & Wyatt, P.C.

(57) ABSTRACT

Embodiments described herein may be related to apparatuses, processes, and techniques for providing a metal routing layer zero (M0) track within a circuit structure that had a width that overlaps both PMOS and NMOS within the circuit structure. There may be three M0 routing tracks, with a first of the M0 routing tracks directly over PMOS, a second of the M0 routing tracks directly over NMOS, and a third of the M0 routing tracks over a portion separating PMOS and NMOS and overlapping both PMOS and NMOS. The wide second routing track will allow efficient electrical coupling between a device on the PMOS and a device on the NMOS. Other embodiments may be described and/or claimed.

22 Claims, 9 Drawing Sheets

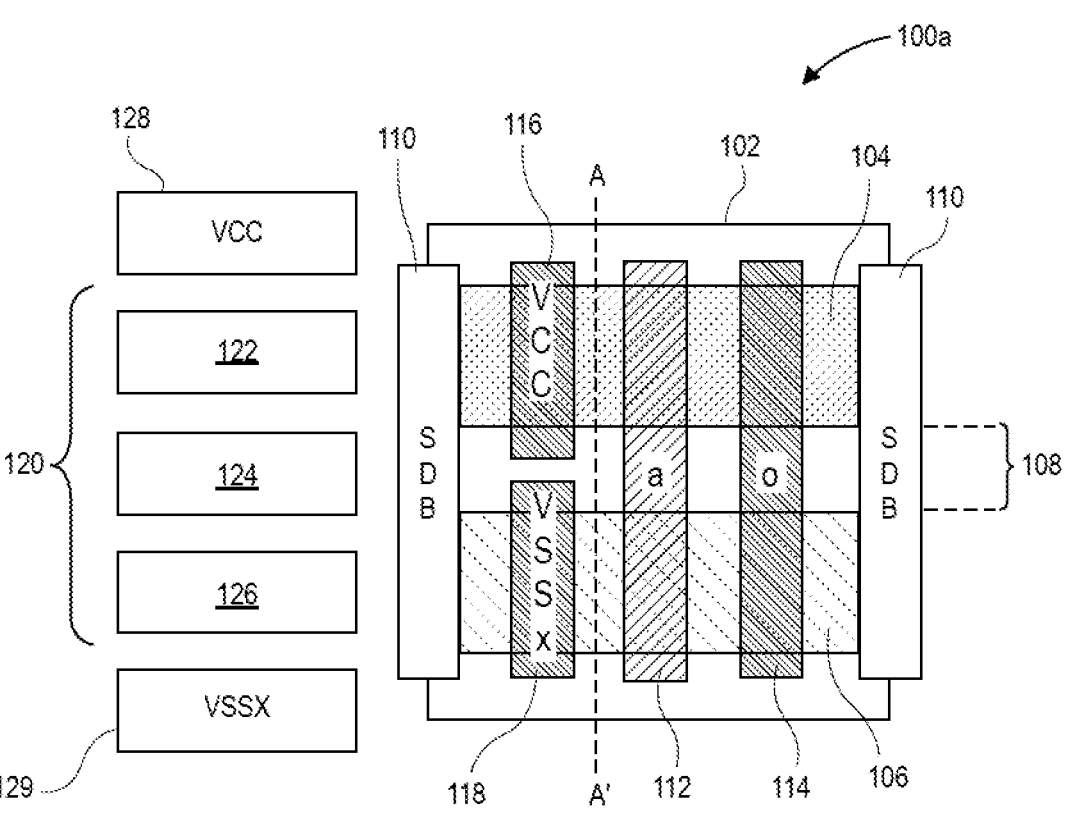
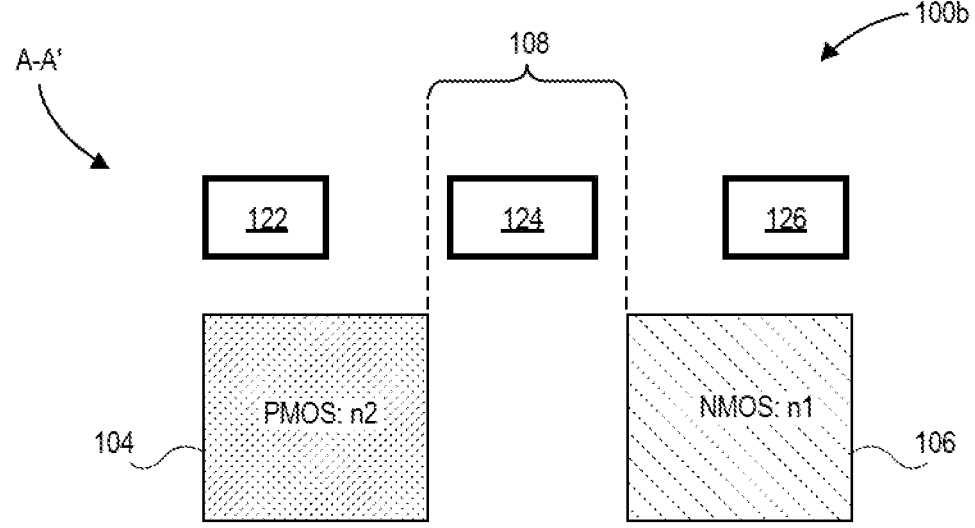
FIG. 1
(PRIOR ART)

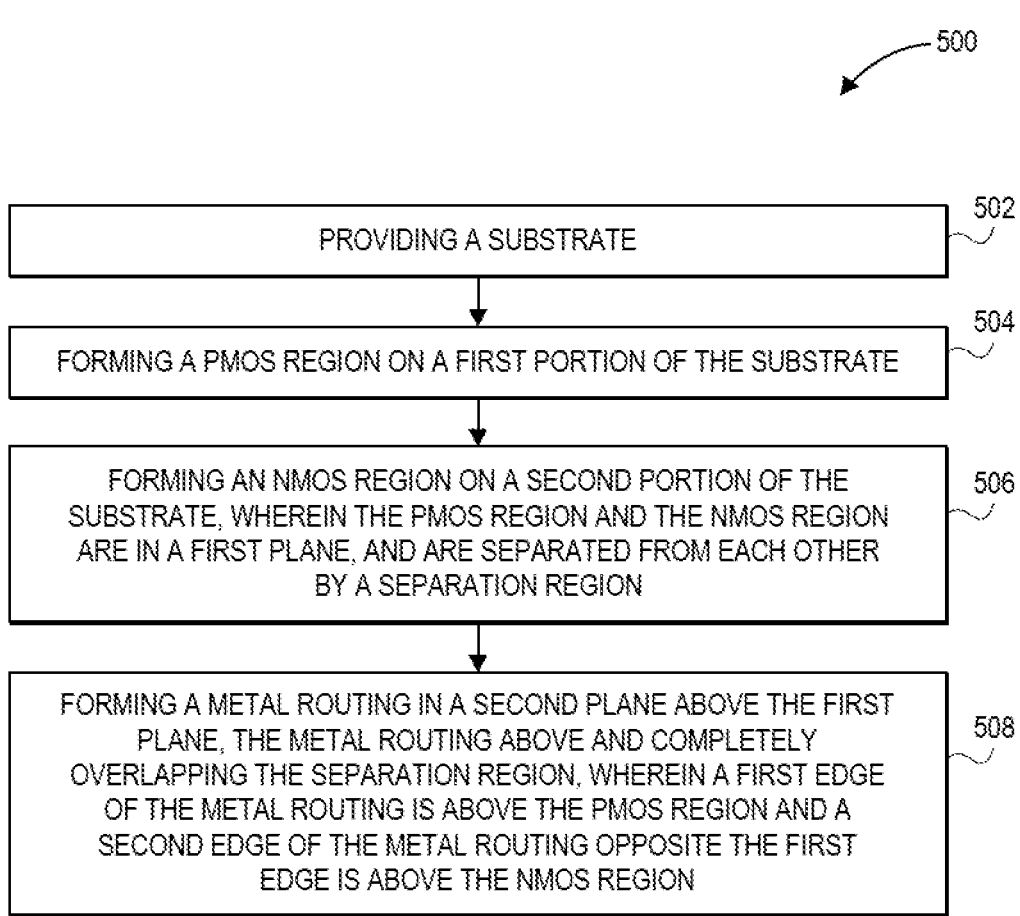

500

502
PROVIDING A SUBSTRATE

504
FORMING A PMOS REGION ON A FIRST PORTION OF THE SUBSTRATE

506
FORMING AN NMOS REGION ON A SECOND PORTION OF THE SUBSTRATE, WHEREIN THE PMOS REGION AND THE NMOS REGION ARE IN A FIRST PLANE, AND ARE SEPARATED FROM EACH OTHER BY A SEPARATION REGION

508
FORMING A METAL ROUTING IN A SECOND PLANE ABOVE THE FIRST PLANE, THE METAL ROUTING ABOVE AND COMPLETELY OVERLAPPING THE SEPARATION REGION, WHEREIN A FIRST EDGE OF THE METAL ROUTING IS ABOVE THE PMOS REGION AND A SECOND EDGE OF THE METAL ROUTING OPPOSITE THE FIRST EDGE IS ABOVE THE NMOS REGION

FIG. 5

METAL ROUTING THAT OVERLAPS NMOS AND PMOS REGIONS OF A TRANSISTOR

FIELD

Embodiments of the present disclosure generally relate to the field of semiconductor packaging, and in particular to circuit structures with metal routing layers.

BACKGROUND

Continued growth in virtual machines, cloud computing, and portable devices will continue to increase the demand for high density transistors within chips and packages.

BRIEF DESCRIPTION OF THE DRAWINGS

FIG. 1 shows top-down view and cross-section side view diagrams of a legacy implementation of a circuit structure that has three routings on a metal zero (M0) layer.

FIG. 5 illustrates an example process for manufacturing a circuit structure that has a routing in the M0 layer that overlaps PMOS and NMOS regions of the circuit structure, in accordance with various embodiments.

DETAILED DESCRIPTION

Figure 2A:
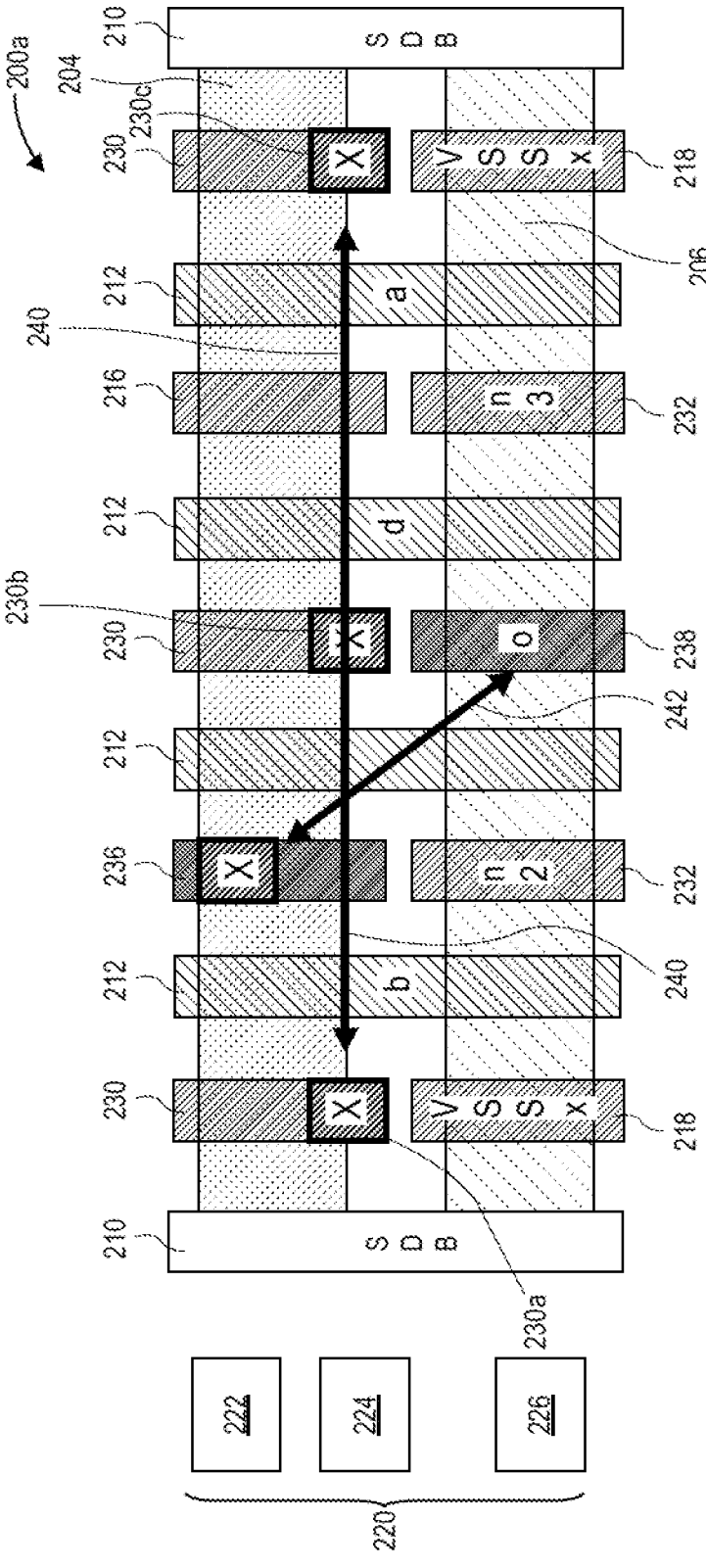
FIGS. 2A-2B show top-down view and cross section side view diagrams of a legacy implementation of a circuit structure that has three routings on the M0 layer, and that has electrical connections with features that are coupled with a PMOS and/or NMOS.

Embodiments described herein may be related to apparatuses, processes, systems, and techniques directed to providing an M0 routing track within a circuit structure that overlaps both PMOS and NMOS within the circuit structure. In embodiments, there may be three M0 routing tracks, with a first of the M0 routing tracks directly over PMOS, a second of the M0 routing tracks directly over NMOS, and a third of the M0 routing tracks over a portion separating PMOS and NMOS and overlapping both PMOS and NMOS.

As circuit structure cell heights are reduced for advanced node structures, cell architecture has begun to address limits regarding resistance of legacy metal routing layer structures. As a result, one effort has been to decrease the number of first metal routing layer (M0) tracks to loosen metal track pitches to lower electrical resistance. As a result, three M0 signal track architectures have become more prominent.

However, these three M0 signal track architectures may make it difficult to achieve desired routings due to the scarcity of M0 tracks. For example, connecting a diffusion contact over NMOS with another diffusion contact over PMOS as discussed further below. As a result, in legacy implementations, additional devices may require to be added to the circuit structure to accommodate such routing, including dummy gates. However, using these legacy approaches cause the physical area of the logic circuit structure to grow in gate pitches. In addition, these legacy approaches may make it hard to connect misaligned gates or misaligned diffusion contacts with the same nets, such as pass gates or complex logic gates, without accruing additional cell growth.

In embodiments described herein, a wide center M0 track that spans PMOS and NMOS regions while running substantially parallel to those regions may provide conductivity flexibility between PMOS devices and NMOS devices. As a result, embodiments described herein may facilitate reduced cell area growth, and make previously unfeasible standard cell sizes possible. For example, with three tracks, in legacy implementations cells may require a greater number of gate pitches to accomplish conductivity of the nodes. For example, a legacy cell may take 8 gate pitches to finish a routing, while using embodiments described herein only six gate pitches may be needed.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 shows top-down view and cross-section side view diagrams of a legacy implementation of a circuit structure that has three routings on a metal zero (M0) layer. Diagram 100a shows a top-down diagram of a circuit structure that shows a cell 102 that includes a PMOS region 104 and NMOS region 106 that are separated by a separation region 108. The cell 102 may include single diffusion break (SDB) structures 110, a gate structure 112, and a drain contact 114, that are all coupled with the PMOS region 104 and NMOS region 106. In addition, a transistor source contact to VCC or power 116 coupled with the PMOS region 104, and another source contact to VSSX or ground structure 118 coupled with the NMOS region 106 are included.

A three routing layer track 120 in the M0 layer, may include a first routing track 122, a second routing track 124, and a third routing track 126. The three routing layer track 120 may be used to route signals in M0 in the circuit structure. Note that a metal routing layer track VCC 128, and metal routing layer track VSSx 129, which may or may not be in the M0 metal layer, may be electrically coupled with the VCC voltage structure 116 and the voltage source supply VSSx structure 118, respectively.

Diagram 100b shows a cross section side view at A-A' in circuit structure diagram 100a. Within the three routing layer track 120, the first routing track is directly above the PMOS region 104, and the third routing track 126 is directly above the NMOS region 106. The second routing track 124 is directly above the separation region 108, and is not above either the PMOS region 104 or the NMOS region 106. Note that in diagram 100b various structures shown in diagram 100a are omitted for clarity.

FIG. 2A shows top-down view and cross section side view diagrams of a legacy implementation of a circuit structure that has three routings on the M0 layer, and that has electrical connections with features that are coupled with a PMOS and/or NMOS. Diagram 200a, may be similar to diagram 100a of FIG. 1. Diagram 200a shows a top-down view of a circuit structure that has a PMOS layer 204, NMOS layer 206, and a routing M0 layer track 220, that includes a first routing track 222, a second routing track 224, and a third routing track 226, which may be similar to the routing M0 layer track 120, first routing track 122, second routing track 124, and third routing track 126 of FIG. 1.

The circuit structure also includes an SDB 210, a plurality of gates 212, VCC 216, and VSSx 218, which may be similar to SDB 110, poly gates 112, VCC 116, and VSSx 118 of FIG. 1. In addition, diffusion contacts 230 may be coupled to the PMOS 204, and diffusion contacts 232 may be coupled to the NMOS 206. In the legacy architecture described with respect to FIG. 1, the second routing track 224 may be used to electrically couple the PMOS 204 diffusion contacts 232 with each other in a connection line 240. In implementations, this may involve creating vias 230a, 230b, 230c along the second routing track 224, and filling the vias with electrically conductive material, such as a conductive metal, to electrically couple the diffusion contacts 232.

In legacy implementations however, output contact 236 that is coupled with the PMOS 204 may need to be electrically coupled with an output contact 238 that is coupled with the NMOS 206. Using the three routing layer track 220, an electrical coupling 242 cannot be done without introducing additional structures such as one or more dummy gates (not shown) within the circuit structure 200a while maintaining the three routing layer track 220.

Figure 2B:
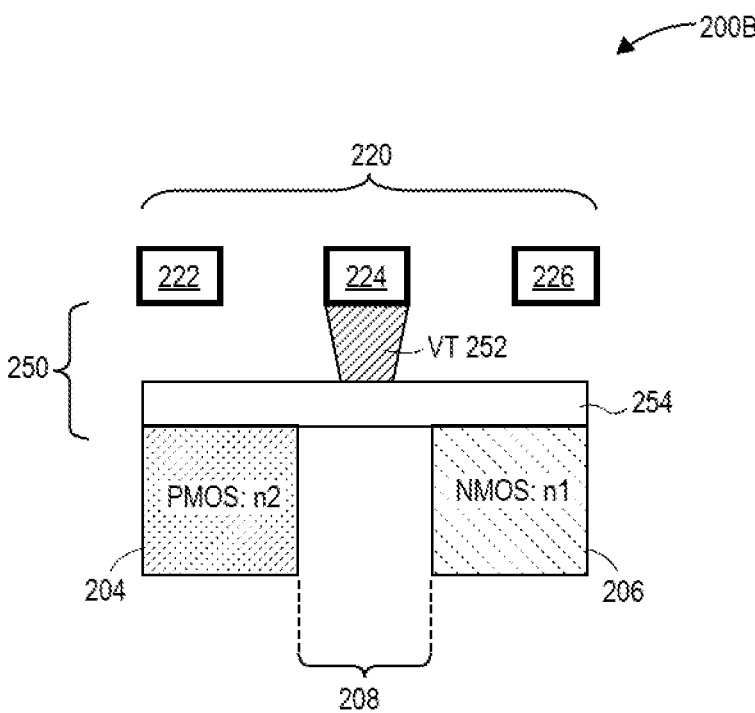

FIG. 2B shows a side view diagram of a legacy implementation of a trench connector flyover architecture used to electrically couple features that are coupled with a PMOS and NMOS, for example to accomplish connection 242 of FIG. 2A. Diagram 200b shows how the second track 224, which is a center track in the three routing layer track 220 in the M0 layer, and directly above the separation region 208, does not overlap the PMOS region 204 or the NMOS region 206. In these implementations, the center track 224 may still be used to electrically couple with the PMOS 204 and/or NMOS 206 sides by adding additional connection layers within the circuit structure. Additional layers 250 are formed to make various connections, which increase the overall height of the circuit structure shown. Additional layers 250 may include a via 252 that electrically couples with metal layer 254, which is coupled with PMOS 204 and with NMOS 206.

Figure 3:
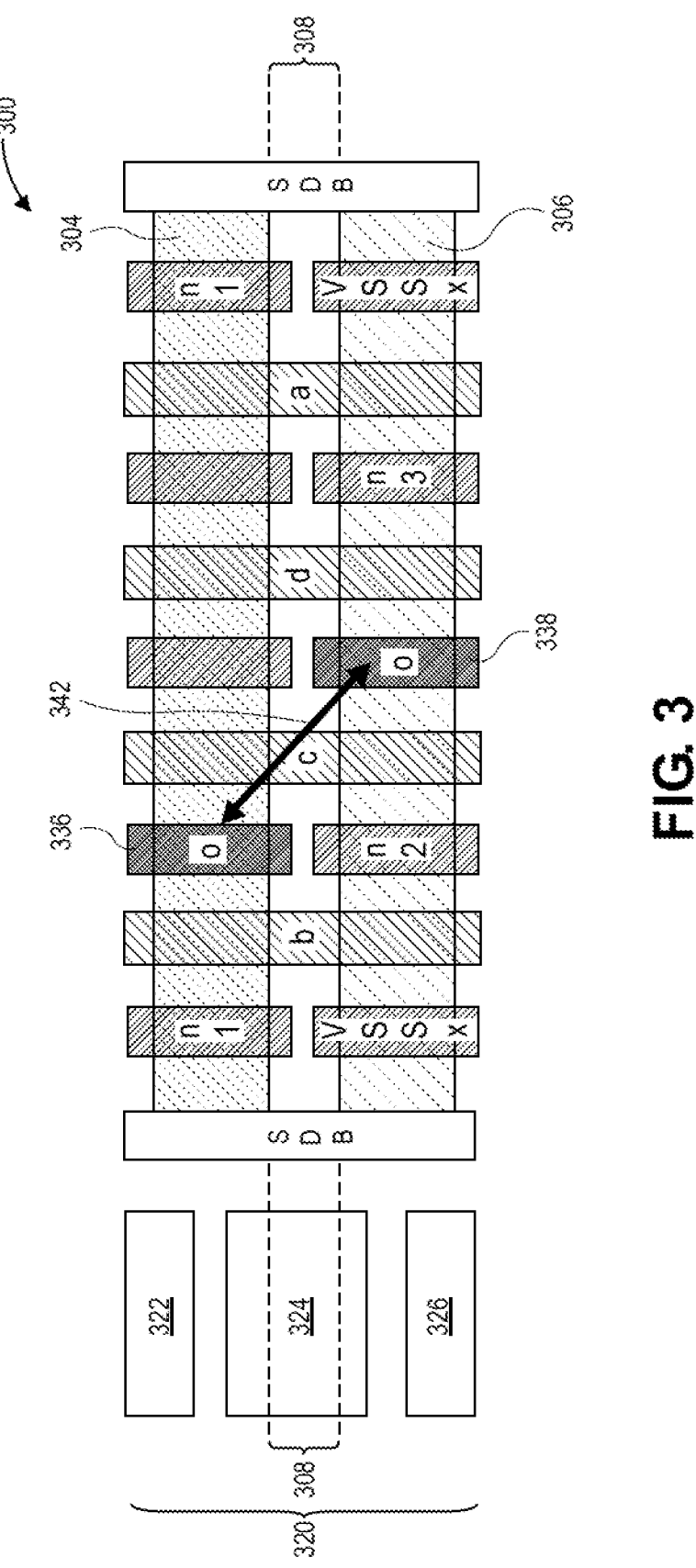
FIG. 3 shows top-down view and cross section side view diagrams of a routing in a M0 routing layer that overlaps PMOS and NMOS regions of a circuit structure, in accordance with various embodiments.

FIG. 3 shows top-down view and cross section side view diagrams of a routing in a M0 routing layer that overlaps PMOS and NMOS regions of a circuit structure, in accordance with various embodiments. Diagram 300, which may be similar to diagram 100a of FIG. 1 and diagram 200a of FIG. 2A, shows an embodiment of a circuit structure with three routing layer track 320 that may be used to route signals in M0 layer in the circuit structure. The three routing layer track 320 may be used to route signals across the circuit structure that includes a PMOS region 304 and an NMOS region 306, which may be similar to PMOS region 104 and NMOS region 106 of FIG. 1. The PMOS region 304 and NMOS region 306 may be separated by a separation region 308, which may be similar separation region 108 of FIG. 1.

The three routing layer track 320 includes a first track 322, a second track 324, which may also be referred to as the middle track, and a third track 326. These may be similar to first track 122, second track 124, and third track 126 of FIG. 1. However, in embodiments, the second or middle track 324 has a width that is wider than separation region 308. As a result, the second track 324 not only is directly above and covers a width of the separation region 308, but also overlaps a portion of the PMOS 304 and the NMOS 306.

In embodiments as discussed further below, the second track 324 is able to facilitate an electrical coupling 342 between a first output node 336 that is above the PMOS 304 and a second output node 338 that is above the NMOS 306.

Figure 4:
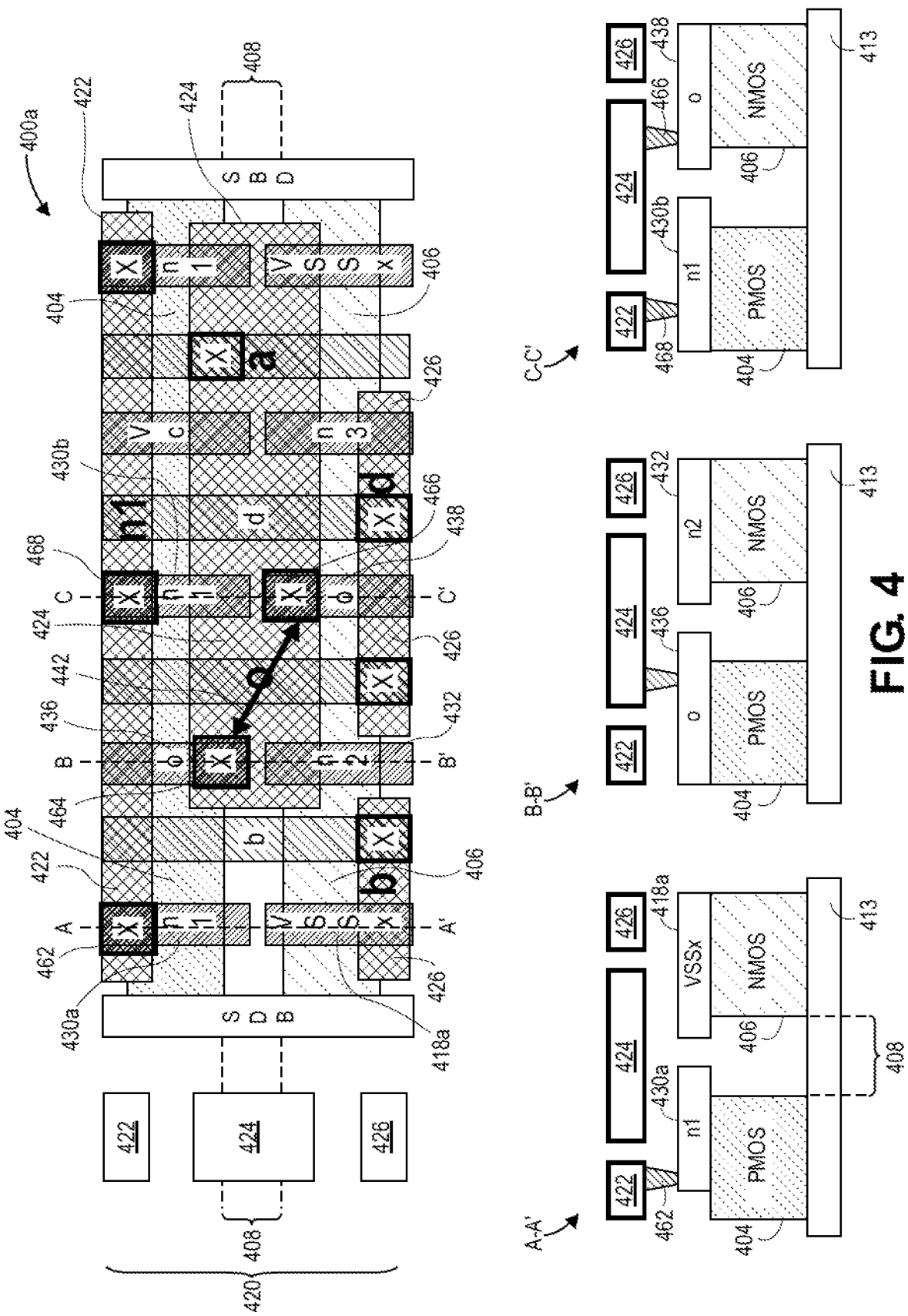
FIG. 4 shows top-down view and cross section side view diagrams of three routings in a M0 routing layer, where one of the routings overlaps PMOS and NMOS regions of a circuit structure, in accordance with various embodiments.

FIG. 4 shows top-down view and cross section side view diagrams of three routings in a M0 routing layer, where one of the routings overlaps PMOS and NMOS regions of a circuit structure, in accordance with various embodiments. Diagram 400a shows a circuit structure that may be similar to the circuit structure of diagram 300 of FIG. 3. The first track 422, the second (or middle) track 424, and the third track 426 extend across the circuit structure. In embodiments, these three tracks are part of the metal routing M0 layer 420, which may be similar to metal routing layer M0 320 of FIG. 3.

In embodiments, the first track 422 may be directly over the PMOS 404, which may be similar to PMOS 304 of FIG. 3. The third track 426 may be directly over the NMOS 406, which may be similar to NMOS 306 of FIG. 3. The second track 424 (or middle track) may be directly over the separation region 408, which may be similar to separation region 308 of FIG. 3, and may also be directly over a portion of the PMOS 404 and/or the NMOS 406.

A plurality of vias 462, 464, 466, 468 extend from the M0 layer toward PMOS 404 or toward NMOS 406 in order to electrically couple devices below the M0 layer with the M0 layer. In particular, at cross section A-A', via 462 electrically couples the first track 422 with a first diffusion contact 430a that is above PMOS 404. This may be similar to diffusion contact 230 of FIG. 2A. Note that at cross section A-A' there is no electrical coupling with the VSSx 418a that is above NMOS 406.

At cross section B-B', via 464 electrically couples the second track 424 with an output node 436 that is over the PMOS 404, which may be similar to output node 336 of FIG. 3. Via 466 electrically couples the second track 424 with an output node 438 that is over the NMOS 406, which may be similar to output node 338 of FIG. 3. As a result, there is an electrical connection 442 formed between the output node 436 and the output node 438 through the second track 424. Note that at cross section B-B' there is no electrical coupling between the first track 422 or the second track 424 and the "n2" node 432.

At cross section C-C', via 468 electrically couples the first track 422 with a second diffusion contact 430b, which may be similar to diffusion contact 230b of FIG. 2A. Note that for cross sections A-A', B-B', and C-C', PMOS 404 and NMOS 406 are on a substrate 413. In embodiments, the substrate 413 may include silicon or include some other dielectric. In embodiments, the substrate 413 may be a portion of a wafer onto which multiple circuit structures may be manufactured.

FIG. 5 illustrates an example process for manufacturing a circuit structure that has a routing in the M0 layer that overlaps PMOS and NMOS regions of the circuit structure, in accordance with various embodiments. In embodiments, process 500 may be performed using any of the processes, techniques, procedures, systems, or apparatus as described above, and in particular with respect to FIGS. 1-4.

At block 502, the process may include providing a substrate. In embodiments, the substrate may be similar to substrate 413 of FIG. 4, and may include a portion of a wafer onto which multiple circuit structures may be manufactured.

At block 504, the process may include forming a PMOS region on a first portion of the substrate. In embodiments, the PMOS region may be similar to PMOS 304 of FIG. 3 or PMOS 404 of FIG. 4.

At block 506, the process may further include forming an NMOS region on a second portion of the substrate, wherein the PMOS region and the NMOS region are in a first plane, and are separated from each other by a separation region. In embodiments, the NMOS region may be similar to NMOS region 306 of FIG. 3, or NMOS region 406 of FIG. 4. In embodiments, the separation region may be similar to separation region 108 of FIG. 1, separation region 308 of FIG. 3, or separation region 408 of FIG. 4.

At block 508, the process may further include forming a metal routing in a second plane above the first plane, the metal routing above and completely overlapping the separation region, wherein a first edge of the metal routing is above the PMOS region and a second edge of the metal routing opposite the first edge is above the NMOS region. In embodiments, the metal routing may be similar to second track 324 of M0 layer 320 of FIG. 3, or may be similar to second track 424 of M0 layer 420 of FIG. 4.

Figure 6A:
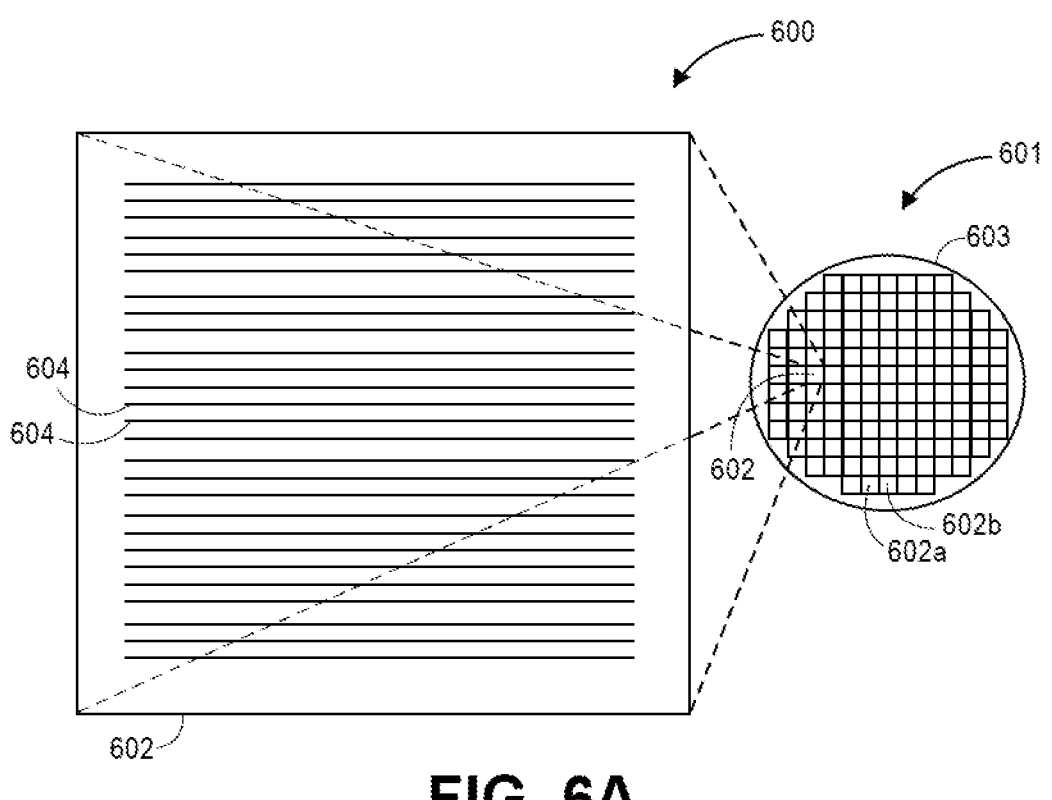
FIGS. 6A-6B schematically illustrate a top view of an example die in wafer form and in singulated form, and a cross section side view of a package assembly, in accordance with various embodiments.
Figure 6B:
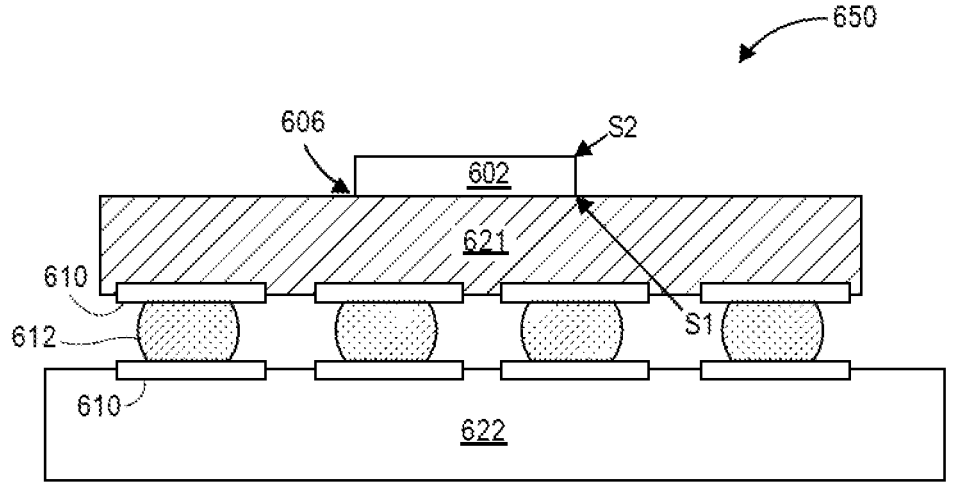

FIGS. 6A-6B schematically illustrate a top view of an example die in wafer form and in singulated form, and a cross section side view of a package assembly, in accordance with various embodiments. FIGS. 6A-6B schematically illustrate a top view of an example die in wafer form and in singulated form, and a cross section side view of a package assembly, in accordance with various embodiments. FIG. 6A schematically illustrates a top view of an example die 602 in a wafer form 601 and in a singulated form 600, in accordance with some embodiments. In some embodiments, die 602 may be one of a plurality of dies, e.g., dies 602, 602a, 602b, of a wafer 603 comprising semiconductor material, e.g., silicon or other suitable material. The plurality of dies, e.g., dies 602, 602a, 602b, may be formed on a surface of wafer 603. Each of the dies 602, 602a, 602b, may be a repeating unit of a semiconductor product that includes devices as described herein. For example, die 602 may include circuitry having elements such as capacitors and/or inductors 604 (e.g., fin structures, nanowires, and the like) that provide a channel pathway for mobile charge carriers in transistor devices. Although one or more capacitors and/or inductors 604 are depicted in rows that traverse a substantial portion of die 602, it is to be understood that one or more capacitors and/or inductors 604 may be configured in any of a wide variety of other suitable arrangements on die 602 in other embodiments.

After a fabrication process of the device embodied in the dies is complete, wafer 603 may undergo a singulation process in which each of dies, e.g., die 602, is separated from one another to provide discrete "chips" of the semiconductor product. Wafer 603 may be any of a variety of sizes. In some embodiments, wafer 603 has a diameter ranging from about 25.4 mm to about 450 mm. Wafer 603 may include other sizes and/or other shapes in other embodiments. According to various embodiments, the one or more capacitors and/or inductors 604 may be disposed on a semiconductor substrate in wafer form 601 or singulated form 600. One or more capacitors and/or inductors 604 described herein may be incorporated in die 602 for logic, memory, or combinations thereof. In some embodiments, one or more capacitors and/or inductors 604 may be part of a system-on-chip (SoC) assembly.

FIG. 6B schematically illustrates a cross-section side view of an integrated circuit (IC) assembly 650, in accordance with some embodiments. In some embodiments, IC assembly 650 may include one or more dies, e.g., die 602, electrically or physically coupled with a package substrate 621. Die 602 may include one or more capacitors and/or inductors 604 as described herein. In some embodiments, package substrate 621 may be electrically coupled with a circuit board 622 as is well known to a person of ordinary skill in the art. Die 602 may represent a discrete product made from a semiconductor material (e.g., silicon) using semiconductor fabrication techniques such as thin film deposition, lithography, etching, and the like. In some embodiments, die 602 may be, include, or be a part of a processor, memory, SoC or ASIC in some embodiments.

Die 602 can be attached to package substrate 621 according to a wide variety of suitable configurations including, for example, being directly coupled with package substrate 621 in a flip-chip configuration, as depicted. In the flip-chip configuration, an active side S1 of die 602 including circuitry is attached to a surface of package substrate 621 using hybrid bonding structures as described herein that may also electrically couple die 602 with package substrate 621. Active side S1 of die 602 may include multi-threshold voltage transistor devices as described herein. An inactive side S2 of die 602 may be disposed opposite to active side S1.

In some embodiments, package substrate 621 is an epoxy-based laminate substrate having a core and/or build-up layers such as, for example, an Ajinomoto Build-up Film (ABF) substrate. Package substrate 621 may include other suitable types of substrates in other embodiments including, for example, substrates formed from glass, ceramic, or semiconductor materials.

Package substrate 621 may include electrical routing features configured to route electrical signals to or from die 602. The electrical routing features may include pads or traces (not shown) disposed on one or more surfaces of package substrate 621 and/or internal routing features (not shown) such as trenches, vias, or other interconnect structures to route electrical signals through package substrate 621. In some embodiments, package substrate 621 may include electrical routing features such as pads (not shown) configured to receive the respective die-level interconnect structures 606 of die 602.

Circuit board 622 may be a printed circuit board (PCB) comprising an electrically insulative material such as an epoxy laminate. Circuit board 622 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures such as traces, trenches, vias may be formed through the electrically insulating layers to route the electrical signals of die 602 through circuit board 622. Circuit board 622 may comprise other suitable materials in other embodiments. In some embodiments, circuit board 622 is a motherboard as is well known to a person of ordinary skill in the art.

Package-level interconnects such as, for example, solder balls 612 may be coupled to one or more pads 610 on package substrate 621 and/or on circuit board 622 to form corresponding solder joints that are configured to further route the electrical signals between package substrate 621 and circuit board 622. Pads 610 may comprise any suitable electrically conductive material such as metal including, for example, nickel (Ni), palladium (Pd), gold (Au), silver (Ag), copper (Cu), and combinations thereof. Other suitable techniques to physically and/or electrically couple package substrate 621 with circuit board 622 may be used in other embodiments.

IC assembly 650 may include a wide variety of other suitable configurations in other embodiments including, for example, suitable combinations of flip-chip and/or wire-bonding configurations, interposers, multi-chip package configurations including system-in-package (SiP), and/or package-on-package (PoP) configurations. Other suitable techniques to route electrical signals between die 602 and other components of IC assembly 650 may be used in some embodiments.

A person of ordinary skill in the art should recognize that any known semiconductor device fabricated using any known semiconductor process that may benefit from the principles described herein.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 7:
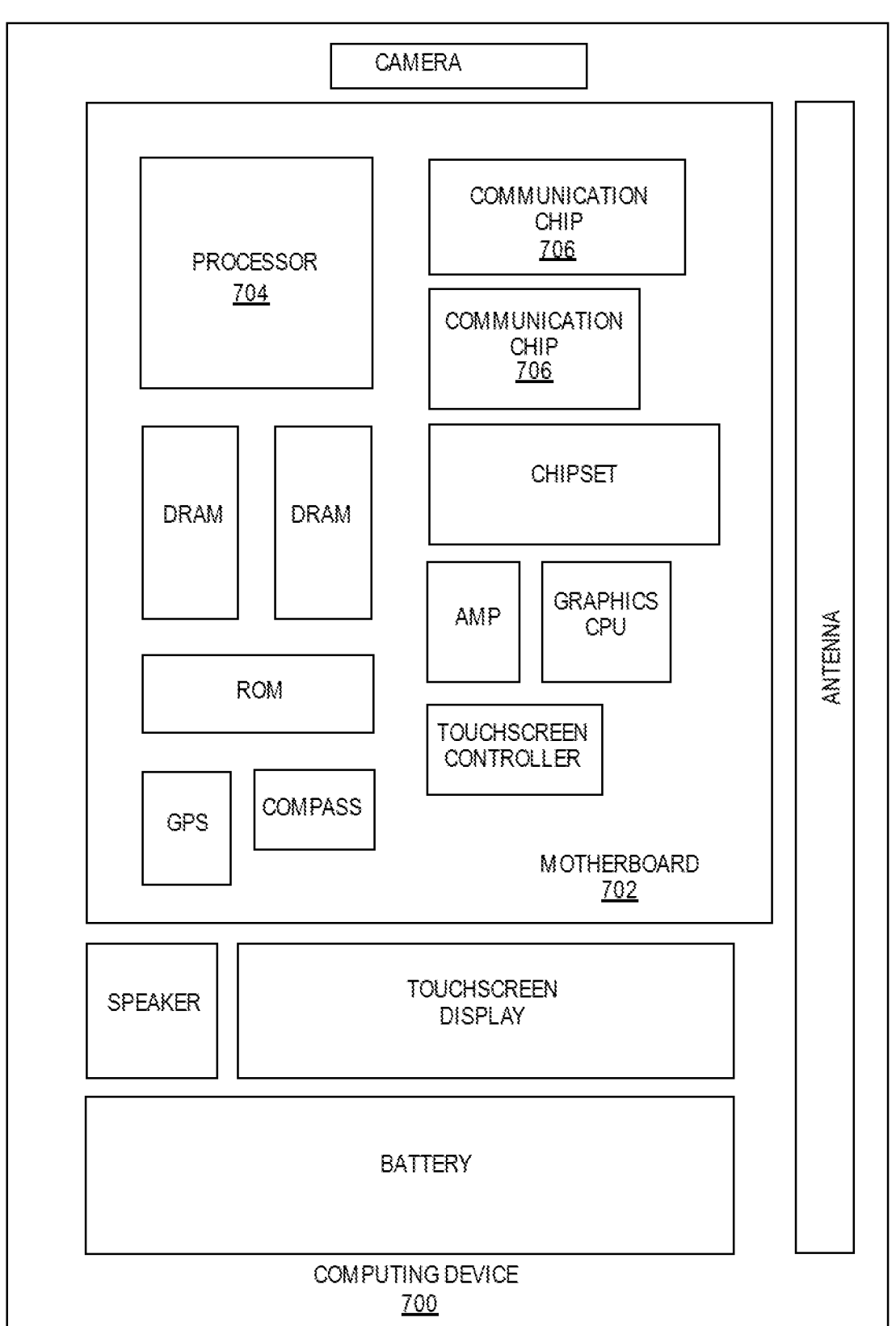
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
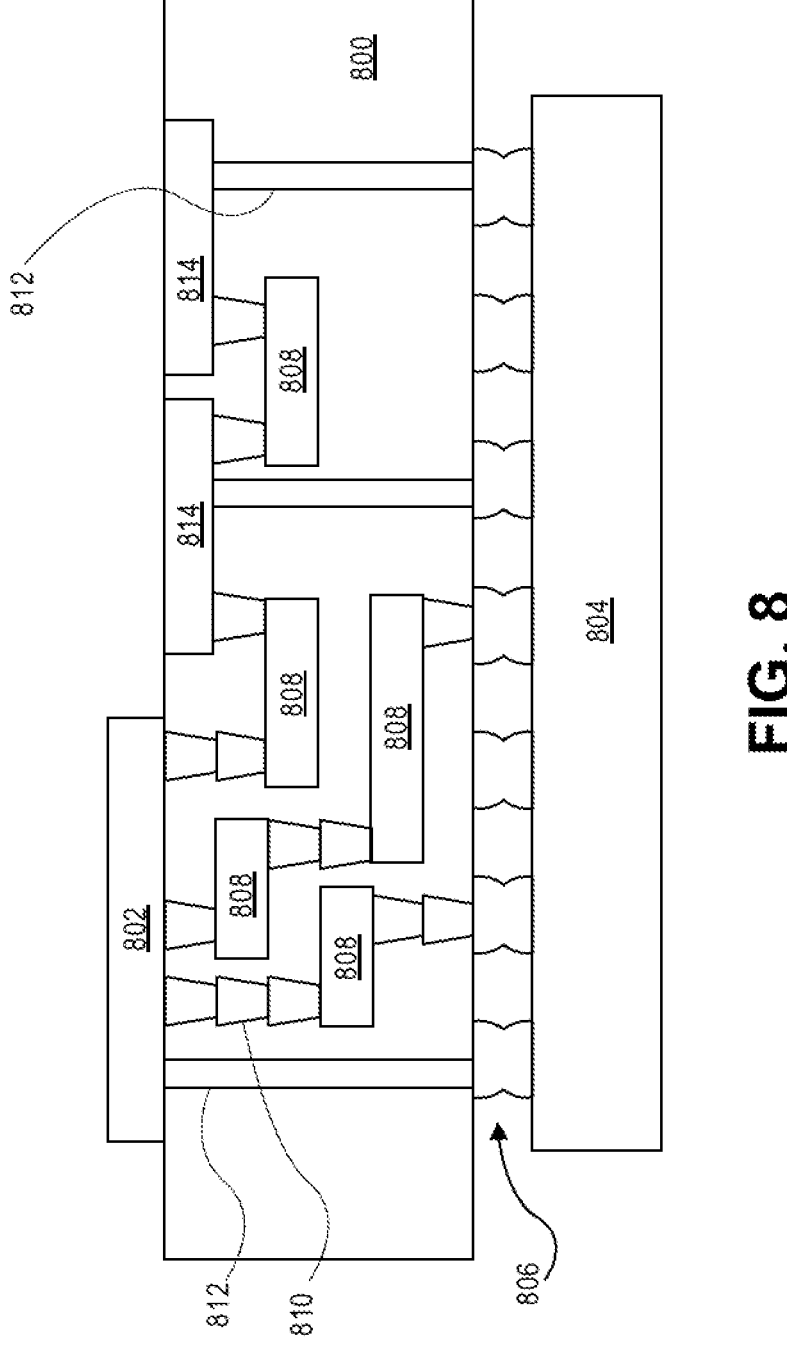
FIG. 8 illustrates an interposer that includes one or more embodiments of the invention.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the invention, apparatuses or processes disclosed herein may be used in the fabrication of interposer 800.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a circuit structure comprising: a PMOS region in a first plane; an NMOS region in the first plane, wherein the PMOS region and the NMOS region are substantially parallel to each other and are separated from each other by a separation region; an electrical routing track in a second plane above a level of the first plane and substantially parallel with the first plane; and wherein a width of a portion of the electrical routing track is directly above and overlaps the separation region, wherein a first side of the width is directly above a portion of the PMOS region, and wherein a second side of the width opposite the first side is directly above a portion of the NMOS region.

Example 2 includes the circuit structure of example 1, or of any other example or embodiment herein, wherein the electrical routing track is electrically coupled with the PMOS region and the NMOS region.

Example 3 includes the circuit structure example 1, or of any other example or embodiment herein, wherein the electrical routing track is substantially parallel with the PMOS region and the NMOS region.

Example 4 includes the circuit structure of example 1, or of any other example or embodiment herein, wherein the electrical routing track is a metal routing within a metal 0 layer of the circuit structure.

Example 5 includes the circuit structure of example 1, or of any other example or embodiment herein, wherein the electrical routing track is a first electrical routing track, and further comprising: a second electrical routing track in the second plane, the second electrical routing track on a first side of the first electrical routing track and above the PMOS region; and a third electrical routing track in the second plane, the third electrical routing track on a second side of the first electrical routing track opposite the first side of the electrical routing track, wherein the third electrical routing track is above the NMOS region.

Example 6 includes the circuit structure of example 5, or of any other example or embodiment herein, wherein the first electrical routing track has a first width, the second electrical routing track has a second width, and the third electrical routing track has a third width; and wherein the first width is greater than the second width or the third width.

Example 7 includes the circuit structure of example 5, or of any other example or embodiment herein, wherein the first electrical routing track, the second electrical routing track, and the third electrical routing track are electrically isolated from each other within the circuit structure.

Example 8 includes the circuit structure of example 5, or of any other example or embodiment herein, wherein the second electrical routing track and the third electrical routing track are metal routings within a metal 0 layer of the circuit structure.

Example 9 includes the circuit structure example 1, or of any other example or embodiment herein, wherein the electrical routing track further includes a first segment and a second segment, and wherein the first segment and the second segment are electrically isolated from each other.

Example 10 includes the circuit structure of example 1, or of any other example or embodiment herein, further comprising: a first feature on the NMOS region; a second feature on the PMOS region; and wherein the electrical routing track electrically couples the first feature with the second feature.

Example 11 includes the circuit structure of example 10, or of any other example or embodiment herein, wherein the first feature and second feature include diffusion contacts.

Example 12 includes the circuit structure of example 10, or of any other example or embodiment herein, further comprising: a first via that extends from a portion of the electrical routing track directly above the NMOS region to the first feature on the NMOS region; and a second via that extends from a portion of the electrical routing track directly above the PMOS region to the second feature on the PMOS region.

Example 13 includes the circuit structure of example 12, or of any other example or embodiment herein, wherein the first via and the second via are filled with a metal that is electrically conductive.

Example 14 is a system comprising: an electrical component; and a circuit structure electrically coupled with the component, the circuit structure including: a PMOS region in a first plane; an NMOS region in the first plane, wherein the PMOS region and the NMOS region are substantially parallel to each other and are separated from each other by a separation region; a first metal routing in a second plane that is above the first plane and parallel to the first plane, wherein the first metal routing is directly above the separation region and wherein a width of the first metal routing overlaps the separation region, wherein a first side of the first metal routing is directly above a portion of the PMOS region, and wherein a second side of the first metal routing opposite the first side of the first metal routing is directly above a portion of the NMOS region; and a second metal routing in the second plane on a side of the first metal routing, wherein the second metal routing is directly above either the PMOS region or the NMOS region.

Example 15 includes the system of example 14, or of any other example or embodiment herein, wherein the first metal routing and the second metal routing are in a metal 0 layer.

Example 16 includes the system of example 14, or of any other example or embodiment herein, wherein the electrical component is a portion of a memory structure.

Example 17 includes the system of example 14, or of any other example or embodiment herein, wherein the first metal routing of the second metal routing are electrically isolated from each other.

Example 18 is a method comprising: providing a substrate; forming a PMOS region on a first portion of the substrate; forming an NMOS region on a second portion of the substrate, wherein the PMOS region and the NMOS region are in a first plane, and are separated from each other by a separation region; and forming a metal routing in a second plane above the first plane, the metal routing above and completely overlapping the separation region, wherein a first edge of the metal routing is above the PMOS region and a second edge of the metal routing opposite the first edge is above the NMOS region.

Example 19 includes the method of example 18, or of any other example or embodiment herein, wherein the metal routing is a first metal routing; and further comprising forming a second metal routing in the second plane above the first plane, wherein the second metal routing at a side of the first metal routing, and wherein the second metal routing is above the PMOS region.

Example 20 includes the method of example 19, or of any other example or embodiment herein, further comprising forming a third metal routing in the second plane above the first plane, wherein the third metal routing is at a side of the first metal routing opposite the second metal routing, and wherein the third metal routing is above the NMOS region.

Example 21 includes the method of example 18, or of any other example or embodiment herein, wherein the metal routing is in a metal 0 layer of a transistor device.

What is claimed is:

1. A circuit structure comprising:
   a PMOS region in a first plane;
   an NMOS region in the first plane, wherein the PMOS region and the NMOS region are substantially parallel to each other and are separated from each other by a separation region;
   an electrical routing track in a second plane above a level of the first plane and substantially parallel with the first plane; and
   wherein a width of a portion of the electrical routing track is directly above and overlaps the separation region, wherein a first side of the width is directly above a portion of the PMOS region, wherein a second side of the width opposite the first side is directly above a portion of the NMOS region, and wherein the electrical routing track has a longest dimension parallel with a longest dimension of the separation region.

2. The circuit structure of claim 1, wherein the electrical routing track is electrically coupled with the PMOS region and the NMOS region.

3. The circuit structure of claim 1, wherein the electrical routing track is substantially parallel with the PMOS region and the NMOS region.

4. The circuit structure of claim 1, wherein the electrical routing track is a metal routing within a metal 0 layer of the circuit structure.

5. The circuit structure of claim 1, wherein the electrical routing track is a first electrical routing track, and further comprising:
   a second electrical routing track in the second plane, the second electrical routing track on a first side of the first electrical routing track and above the PMOS region; and
   a third electrical routing track in the second plane, the third electrical routing track on a second side of the first electrical routing track opposite the first side of the electrical routing track, wherein the third electrical routing track is above the NMOS region.

6. The circuit structure of claim 5, wherein the first electrical routing track has a first width, the second electrical routing track has a second width, and the third electrical routing track has a third width; and
   wherein the first width is greater than the second width or the third width.

7. The circuit structure of claim 5, wherein the first electrical routing track, the second electrical routing track, and the third electrical routing track are electrically isolated from each other within the circuit structure.

8. The circuit structure of claim 5, wherein the second electrical routing track and the third electrical routing track are metal routings within a metal 0 layer of the circuit structure.

9. The circuit structure of claim 1, wherein the electrical routing track further includes a first segment and a second segment, and wherein the first segment and the second segment are electrically isolated from each other.

10. The circuit structure of claim 1, further comprising:

a first feature on the NMOS region;

a second feature on the PMOS region; and wherein the electrical routing track electrically couples the first feature with the second feature.

11. The circuit structure of claim 10, wherein the first feature and second feature include diffusion contacts.

12. The circuit structure of claim 10, further comprising:

a first via that extends from a portion of the electrical routing track directly above the NMOS region to the first feature on the NMOS region; and a second via that extends from a portion of the electrical routing track directly above the PMOS region to the second feature on the PMOS region.

13. The circuit structure of claim 12, wherein the first via and the second via are filled with a metal that is electrically conductive.

14. A system comprising:

an electrical component; and a circuit structure electrically coupled with the component, the circuit structure including:

a PMOS region in a first plane;

an NMOS region in the first plane, wherein the PMOS region and the NMOS region are substantially parallel to each other and are separated from each other by a separation region;

a first metal routing in a second plane that is above the first plane and parallel to the first plane, wherein the first metal routing is directly above the separation region and wherein a width of the first metal routing overlaps the separation region, wherein a first side of the first metal routing is directly above a portion of the PMOS region, wherein a second side of the first metal routing opposite the first side of the first metal routing is directly above a portion of the NMOS region, and wherein the first metal routing has a longest dimension parallel with a longest dimension of the separation region; and a second metal routing in the second plane on a side of the first metal routing, wherein the second metal routing is directly above either the PMOS region or the NMOS region.

15. The system of claim 14, wherein the first metal routing and the second metal routing are in a metal 0 layer.

16. The system of claim 14, wherein the electrical component is a portion of a memory structure.

17. The system of claim 14, wherein the first metal routing and the second metal routing are electrically isolated from each other.

18. A circuit structure comprising:

a PMOS region in a first plane;

an NMOS region in the first plane, wherein the PMOS region and the NMOS region are substantially parallel to each other and are separated from each other by a separation region;

a first electrical routing track in a second plane above a level of the first plane and substantially parallel with the first plane;

wherein a width of a portion of the first electrical routing track is directly above and overlaps the separation region, wherein a first side of the width is directly above a portion of the PMOS region, and wherein a second side of the width opposite the first side is directly above a portion of the NMOS region;

a second electrical routing track in the second plane, the second electrical routing track on a first side of the first electrical routing track and above the PMOS region; and a third electrical routing track in the second plane, the third electrical routing track on a second side of the first electrical routing track opposite the first side of the electrical routing track, wherein the third electrical routing track is above the NMOS region, and wherein the first electrical routing track has a longest dimension parallel with a longest dimension of the second electrical routing track and with a longest dimension of the third electrical routing track.

19. The circuit structure of claim 18, wherein the first electrical routing track has a first width, the second electrical routing track has a second width, and the third electrical routing track has a third width; and wherein the first width is greater than the second width or the third width.

20. The circuit structure of claim 18, wherein the first electrical routing track, the second electrical routing track, and the third electrical routing track are electrically isolated from each other within the circuit structure.

21. The circuit structure of claim 18, wherein the second electrical routing track and the third electrical routing track are metal routings within a metal 0 layer of the circuit structure.

22. A circuit structure comprising:

a PMOS region in a first plane;

an NMOS region in the first plane, wherein the PMOS region and the NMOS region are substantially parallel to each other and are separated from each other by a separation region;

an electrical routing track in a second plane above a level of the first plane and substantially parallel with the first plane; and wherein a width of a portion of the electrical routing track is directly above and overlaps the separation region, wherein a first side of the width is directly above a portion of the PMOS region, wherein a second side of the width opposite the first side is directly above a portion of the NMOS region, and wherein the electrical routing track further includes a first segment and a second segment, wherein the first segment and the second segment are electrically isolated from each other, and wherein the electrical routing track has a longest dimension parallel with a longest dimension of the first segment and with a longest dimension of the second segment.

* * * * *